United States Patent
Miyashita et al.

[11] Patent Number: 5,380,608
[45] Date of Patent: Jan. 10, 1995

[54] PHASE SHIFT PHOTOMASK COMPRISING A LAYER OF ALUMINUM OXIDE WITH MAGNESIUM OXIDE

[75] Inventors: Hiroyuki Miyashita; Masahiro Takahashi; Hiroshi Mohri, all of Tokyo, Japan

[73] Assignee: Dai Nippon Printing Co., Ltd., Tokyo, Japan

[21] Appl. No.: 974,919

[22] Filed: Nov. 12, 1992

[30] Foreign Application Priority Data

Nov. 12, 1991 [JP] Japan .................. 3-295610
Apr. 8, 1992 [JP] Japan .................. 4-087072
Apr. 8, 1992 [JP] Japan .................. 4-087073

[51] Int. Cl.$^6$ ............................................. G03F 9/00
[52] U.S. Cl. ............................ 430/5; 430/311; 430/313
[58] Field of Search ............ 430/5, 22, 269, 311, 430/321, 313, 396

[56] References Cited

U.S. PATENT DOCUMENTS 4,440,841 4/1984 Tabuchi ......................... 430/5
5,246,799 9/1993 Pierrat ........................... 430/5

FOREIGN PATENT DOCUMENTS 0395425 10/1990 European Pat. Off. .
61-278179 12/1986 Japan .

*Primary Examiner*—Steve Rosasco
*Attorney, Agent, or Firm*—Dellett and Walters

[57] ABSTRACT

The invention is directed to a phase shift photomask for which a film made of a material capable of providing an etching stopper layer that excels in etching selectivity and can interrupt etching surely and automatically, and provides a phase shift photomask at least comprising a substrate 30 and a phase shifter pattern made of a material composed mainly of silicon oxide that is provided on the surface of the substrate directly or with an opaque layer 37 interposed therebetween, said phase shift photomask being characterized in that the surface 30 is provided on the surface with an etching stopper layer 30 that comprises a mixture of $Al_2O_3$ with MgO, $ZrO_2$, $Ta_2O_5$ or HfO, or $CrO_x$, $CrN_y$, $CrC_z$, $CrO_xN_y$, $CrO_xC_z$ or $CrO_xN_yC_z$, or $MgF_{2-2x}O_y$, $CaF_{2-2x}O_y$, $LiF_{2-2x}O_y$, $BaF_{2-2x}O_y$, $La_2F_{6-2x}O_y$ or $Ce_2F_{6-2x}O_y$, whereby the etching stopper layer is allowed to etch a transparent film for a phase shifter surely and accurately, when making a phase shifter pattern by etching.

5 Claims, 5 Drawing Sheets

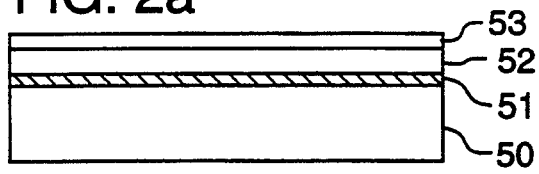
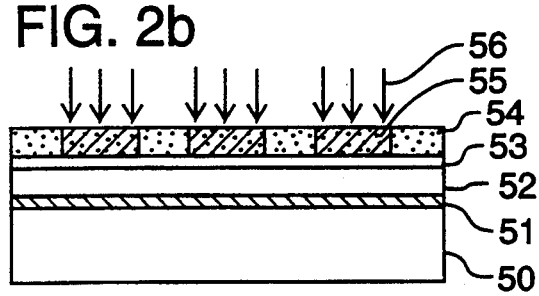
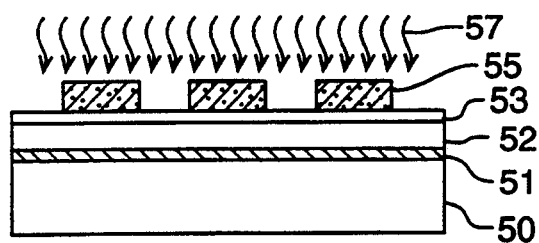
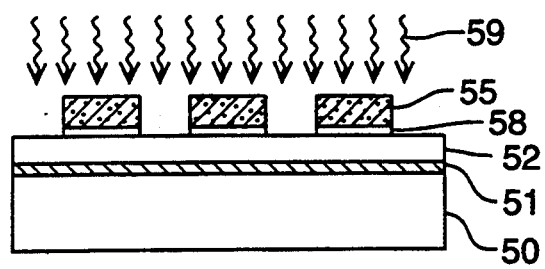
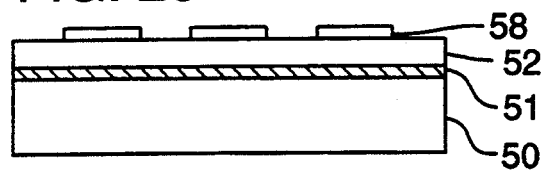
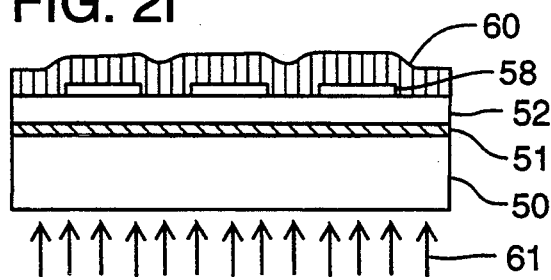
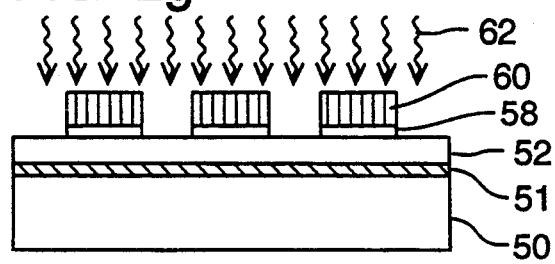
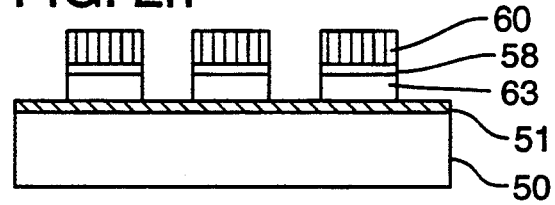
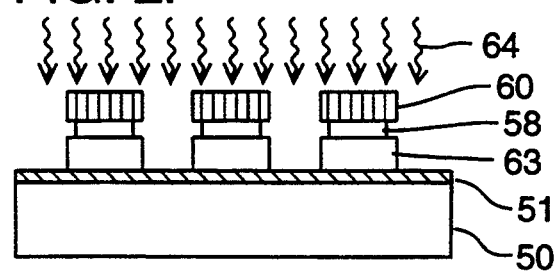
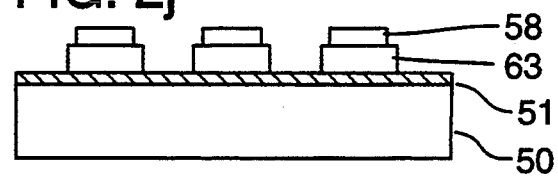

PHASE SHIFT PHOTOMASK COMPRISING A LAYER OF ALUMINUM OXIDE WITH MAGNESIUM OXIDE

BACKGROUND OF THE INVENTION

The present invention relates generally to photomasks used for producing high-density integrated circuits such as LSIs and VLSIs and more particularly to phase shift layer-containing phase shift photomasks designed for forming fine patterns with high accuracy.

So far, semiconductor integrated circuits such as ICs, LSIs and VLSIs have been produced by repeating a so-called lithographic process wherein resists are applied on the substrates to be processed, like Si wafers, and the substrates are then exposed to light through steppers (step-and-repeat photolithographic systems with demagnification) or other like hardware to form the desired patterns, followed by development and etching.

The photomasks used in such a lithographic process and called "reticles" are now increasingly required to have much higher accuracy as current semiconductor integrated circuits are higher in performance and integration than ever before. Referring to a DRAM that is a typical LSI as an example, a dimensional variation of a five-fold reticle for a 1 megabit DRAM, i.e., of a reticle five-fold greater in size than the pattern to be exposed to light, is required to have an accuracy of 0.15 $\mu$m even where the mean value=$\pm 3\sigma$ ($\sigma$ is standard deviation). Likewise, five-fold reticles for 4- and 16-megabit DRAMs are required to have an accuracy of 0.1 to 0.15 $\mu$m and 0.05 to 0.1 $\mu$m, respectively.

Furthermore, the line widths of device patterns formed with these reticles must be much finer, say, 1.2 $\mu$m for 1-megabit DRAMs and 0.8 $\mu$m for 16-megabit DRAMs, and various photolithographic processes are now being studied to meet such demand.

With the next, . . . generation device patterns of, e.g., the 64-megabit DRAM class, however, "stepper" systems using conventional reticles have been found to place some limitation on the resolution of resist patterns. Thus, a version of reticle based on a new idea, like those set forth in JP-A-58-173744 laid open for public inspection, JP-B-62-59296, etc., and referred to as phase shift masks, has been proposed in the art. Phase shift lithography using this reticle is a technique designed to improve the resolving power and contrast of a projected image by controlling the phase of light transmitting through the reticle.

Phase shift lithography will now be briefly explained with reference to FIGS. 4a–d and 5l–d. FIG. 4a–d is diagrammatic representation of the principles of the phase shift process and FIG. 5a–d is a diagrammatic illustration of a conventional process. FIGS. 4a and 5a are sectional views of reticles; FIGS. 4b and 5b show the amplitude of light on the reticles; FIGS. 4c and 5c depict the amplitude of light on wafers; and FIGS. 4d and 5d illustrate the intensity of light on the wafers. In FIG. 4a and 5a, reference numeral 1 stands for a substrate, 2 an opaque layer, 3 a phase shifter and 4 incident light.

In the conventional process, as illustrated in FIG. 5a, the substrate 1 formed as of quartz glass is provided thereon with the opaque layer 2 formed as of chromium, only to form a given pattern of light-transmitting regions. In phase shift lithography, however, the phase shifter 3 made up of a transparent film to cause phase reversal (with a phase difference of 180°) is mounted on one of the adjacent light-transmitting regions on a reticle, as sketched in FIG. 4a. According to the conventional process, therefore, the amplitude of light on the reticle is in the same phase, as illustrated in FIG. 5b, as is the amplitude of light on the wafer, as depicted in FIG. 5c, with the result that the patterns on the wafer can no longer be separated from each other, as sketched in FIG. 5d. By contrast, the phase shift lithography enables the adjacent patterns to be distinctly separated from each other, as illustrated in FIG. 4d, because the light transmitting through the phase shifter is reversed in phase between the adjacent patterns, as depicted in FIG. 4b, so that the intensity of light on the pattern boundary can be reduced to zero. With the phase shift lithography, even patterns that cannot previously be separated from each other are thus made separable from each other, thereby achieving high resolution.

One example of conventional processes of producing phase shift reticles will now be explained with reference to FIG. 6a–m that is a series of sectional views illustrating the steps of producing a typical phase shift reticle. In FIG. 6a–m, reference numeral 11 denotes a quartz substrate, 12 a chromium film, 13 a resist layer, 14 ionizing radiations, 15 a resist pattern, 16 an etching gas plasma, 17 a chromium pattern, 18 an oxygen plasma, 19 a transparent film, 20 a resist layer, 21 ionizing radiations, 22 a resist pattern, 23 an etching gas plasma, 24 a phase shift pattern and 25 an oxygen plasma.

As illustrated in FIG. 6a, the chromium film 12 is first formed on the substrate 11 that is optically polished, and an ionizing radiation resist such as chlorolomethylated polystyrene is uniformly coated thereon in conventional manners such as spin coating and heated for drying to form the resist layer 13 of about 0.1 to 2.0 $\mu$m in thickness. The drying-by-heating treatment may usually be carried out at 80° to 150° C. for about 20 to 60 minutes, although varying depending on the type of resist used.

Then, as illustrated in FIG. 6b, a pattern is conventionally drawn on the resist layer 13 by the ionizing radiations 14 from photolithographic hardware such as an electron beam exposure system, then developed with a developer composed mainly of an organic solvent such as ethyl cellosolve or ester, and finally rinsed with an alcohol to form the resist pattern 15 such as one shown in FIG. 6c.

If required, heating and descumming treatments are further carried out to remove unnecessary resist portions such as resist scum and whiskers, if any, from the edge regions, etc., of the resist pattern 15. After that, as shown in FIG. 6d, the portions to be processed, that are exposed between the pattern (15) lines, i.e., the chromium layer 12 is etched dry by the etching gas plasma 16 to form the chromium pattern 17. As will be obvious to those skilled in the art, the formation of this chromium pattern 17 may be achieved as well, using wet etching in place of the dry etching with the etching gas plasma 16.

Following etching having been done in this manner, the resist pattern 15, i.e., the remaining resin is incinerated out by the oxygen plasma 18, as shown in FIG. 6e, thereby obtaining such a complete photomask as shown in FIG. 6f. It is noted that this incineration treatment using the oxygen plasma 18 may also be replaced by solvent removal.

Subsequently, this photomask is checked up to make some modification to the pattern, if required, followed by cleaning. After that, the transparent film 19 made as of $SiO_2$ is formed on the chromium pattern 17, as shown in FIG. 6g. Then, as depicted in FIG. 6h, the ionizing radiation resist 20 such as chloromethylated polystyrene is formed on the transparent film 19 in similar manners as mentioned above, followed by alignment of the resist patterns 20, as shown in FIG. 6i. Subsequent drawing of a given pattern with the ionizing radiations 21, development and rinsing give the resist pattern 22, as illustrated in FIG. 6j.

Then, heating and descumming treatments are done, if required, and portions of the transparent film 19 exposed between the resist pattern (22) lines are then etched dry by the etching gas plasma 23 to form the phase shifter pattern 24, as illustrated in FIG. 6k. As will be obvious to those skilled in the art, the formation of this phase shifter pattern 24 may be achieved as well, using wet etching in place of the dry etching with the etching gas plasma 23.

Finally, the remaining resist is incinerated out by the oxygen plasma 25, as shown in FIG. 6l. Through the foregoing steps, such a phase shift mask containing the phase shifters 24 as shown in FIG. 6m is completed.

In the above-mentioned, conventional process of producing phase shift reticles, however, it is required to place the transparent film 19 to be formed with phase shifters under strict etching control in the depthwise direction. Especially because both the substrate 11 and the transparent film 19 are made of the same material based on $SiO_2$, the substrate 11 is etched as well upon etching continued even after the etching of the transparent film 19 has been completed. This in turn makes the amount of phase shift of the phase shifters greater than 180° and so renders precise pattern transfer difficult.

In view of the foregoing, the present applicant has come up with the provision of an etching stopper layer between the transparent film to be formed thereon with phase shifters and the substrate, thereby interrupting etching automatically (see JP-A-2-29801 and JP-A-2-181795). As set forth in these specifications, the etching stopper layer is made of such materials as tantalum, molybdenum, tungsten, silicon nitride and $SnO_2$. Among these, $SnO_2$ is currently used for etching stopper layers. $SnO_2$ is a material that is well known to provide a transparent, electrically conductive film, but shows absorption in an ultraviolet wavelength range and so drops in terms of transmittance. In order to secure an i-line (of a mercury lamp light source ($\lambda=365$ nm)) transmittance of 85% or higher, the film must be 15 nm or less in thickness. In addition, a dry etch ratio with respect to the phase shifter layer is insufficient or, in a more precise term, 10 or less.

Moreover, with an etching stopper layer of such materials it is not necessarily easy to interrupt etching precisely enough to be well very satisfactory.

SUMMARY OF THE INVENTION

In view of such situations as mentioned above, an object of the invention is to provide a phase shift photomask making use of a film comprising a material that is capable of providing an etching stopper layer of satisfactory enough selectivity with respect to etching (or etching selectivity) and interrupting etching surely and precisely.

As a result of studies made in view of the problems mentioned above and so as to develop a phase shifter for a phase shift reticle that serves well practical purposes and is of high accuracy, it has now been found that mixtures of $Al_2O_3$ with MgO, $ZrO_2$, $Ta_2O_5$, HfO or the like are excellent in etching selectivity and humidity resistance; $CrO_x$, $CrN_y$, $CrC_z$, $CrO_xN_y$, $CrO_xC_z$ and $CrO_xN_yC_z$ used as the low-reflectivity chromium layers of opaque layers are excellent in etching selectivity; and a film of a metal fluoride oxide obtained by sputtering in a sputtering gas comprising a mixture of an inert gas with oxygen is excellent in etching selectivity, of satisfactory enough transparency in an ultraviolet wavelength range and of high hardness, as is substantially the case with a metal fluoride. These findings underlie the present invention.

To be more specific, according to the first aspect of the invention there is provided a phase shift photomask at least comprising a substrate and a phase shifter pattern comprising a material composed mainly of silicon oxide that is provided on the surface of the substrate directly or with an opaque layer interposed therebetween, characterized in that the substrate is provided on the surface with a film that comprises a mixture of $Al_2O_3$ with MgO, $ZrO_2$, $Ta_2O_5$ or HfO.

According to the second aspect of the invention there is provided a phase shift photomask at least comprising a substrate and a phase shifter pattern comprising a material composed mainly of silicon oxide that is provided on the surface of the substrate directly or with an opaque layer interposed therebetween, characterized in that the substrate is provided on the surface with an etching stopper layer that comprises $CrO_x$, $CrN_y$, $CrC_z$, $CrO_xN_y$, $CrO_xC_z$ or $CrO_xN_yC_z$.

In the second aspect of the invention, when the phase shifter pattern is provided on the surface of the substrate through the opaque layer, it is desired that a protective layer as a silicon oxide layer be interposed between the etching stopper layer and the opaque layer.

According to the third aspect of the invention there is provided a phase shift photomask at least comprising a substrate and a phase shifter pattern comprising a material composed mainly of silicon oxide that is provided on the surface of the substrate directly or with an opaque layer interposed therebeween, characterized in that the substrate is provided on the surface with a film that comprises $MgF_{2-2x}O_y$, $CaF_{2-2x}O_y$, $LiF_{2-2x}O_y$, $BaF_{2-2x}O_y$, $La_2F_{6-2x}O_y$ or $Ce_2F_{6-2x}O_y$.

In the first phase shift photomask of the invention wherein the substrate is provided on the surface with a film that comprises a mixture of $Al_2O_3$ with MgO, $ZrO_2$, $Ta_2O_5$ or HfO, the film that comprises a mixture of $Al_2O_3$ with MgO, $ZrO_2$, $Ta_2O_5$ or HfO serves as an etching stopper layer when making the phase shifter pattern by etching, so that a transparent film for the phase shifter can surely be etched and etching can be interrupted automatically, thus improving the phase shift photomask qualitywise. In addition, since the above-mentioned film is excellent in humidity resistance, the phase shift photomask made in such manners as mentioned above is less likely to undergo environmental degradation and so can serve long.

In the second phase shift photomask of the invention wherein the substrate is provided on the surface with an etching stopper layer that comprises $CrO_x$, $CrN_y$, $CrC_z$, $CrO_xN_y$, $CrO_xC_z$ or $CrO_xN_yC_z$, $CrO_x$, $CrN_y$, $CrC_z$, $CrO_xN_y$, $CrO_xC_z$ or $CrO_xN_yC_z$ serves as an etching stopper layer when making the phase shifter pattern by etching, so that a transparent film for the phase shifter can surely be etched and etching can be interrupted automatically, thus improving the quality of the phase shift photomask. In addition, since the above-mentioned layer is made of the material that is used as the low-reflectivity chromium layer for an opaque layer, the phase shift photomask can be easily produced with no need of using any special material and equipment and without making considerable modifications to the production process.

In the third phase shift photomask of the invention wherein the substrate is provided on the surface with a film that comprises $MgF_{2-2x}O_y$, $CaF_{2-2x}O_y$, $LiF_{2-2x}O_y$, $BaF_{2-2x}O_y$, $La_2F_{6-2x}O_y$ or $Ce_2F_{6-2x}O_y$, these compounds serve as an etching stopper layer when making the phase shifter pattern by etching, so that a transparent film for the phase shifter can surely be etched and etching can be interrupted automatically, thus improving the quality of the phase shift photomask. In addition, since the above-mentioned film is of satisfactory transparency to an ultraviolet wavelength range, it lends itself fit for a phase shift photomask, and since it is of high hardness, the phase shift mask made in the manner mentioned above is less likely to undergo environmental degradation and so can serve long.

Still other objects and advantages of the invention will in part be obvious and will in part be apparent from the specification.

The invention accordingly comprises the features of construction, combinations of elements, and arrangement of parts which will be exemplified in the construction hereinafter set forth, and the scope of the invention will be indicated in the claims.

BRIEF DESCRIPTION OF THE DRAWINGS

Some preferred embodiments of the invention will now be described by way of example with reference to the accompanying drawings, in which:

FIG. 2a-j illustrates in section a series of steps of the process of producing another phase shift photomask according to the invention.

DESCRIPTION OF THE PREFERRED EMBODIMENTS

Figure 1A:
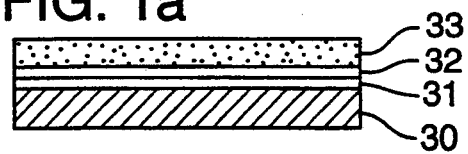
FIG. 1a-m represents in section a series of steps of the process of producing the first and third phase shift photomasks according to the invention.

The first phase shift photomask of the invention is characterized in that as an etching stopper layer a film comprising a mixture of $Al_2O_3$ with MgO, $ZrO_2$, $Ta_2O_5$, HfO or the like is interposed between the substrate and the transparent film for the phase shifter. Generally, $Al_2O_3$ is known as a material that shows good transmittance on a short wavelength side, and has an i-line transmittance of 90% or more as well. However, it is poor in the acid resistance required at the step of cleaning photomasks, and so is practically used with some difficulty.

The first aspect of the invention is characterized in that the phase shift photomask is improved in terms of acid resistance without any substantial transmittance drop by using a mixture of $Al_2O_3$ with MgO, $ZrO_2$, $Ta_2O_5$, HfO or the like as the etching stopper layer. One example of the phase shift photomask according to the first aspect of the invention will now be explained with reference to the process of producing it.

FIG. 1a-m represents in section a series of steps of the process of producing the first (phase shift) photomask containing a phase shift layer according to the invention. In FIG. 1a-m, reference numeral 30 stands for a substrate, 31 an etching stopper layer comprising a mixture of $Al_2O_3$ with MgO, $ZrO_2$, $Ta_2O_5$ or HfO, 32 an opaque layer, 33 a resist layer, 34 ionizing radiations, 35 a resist pattern, 36 an etching gas plasma, 37 an opaque layer, 38 an oxygen plasma, 39 a transparent film, 40 a resist layer, 41 ionizing radiations, 42 a resist pattern, 43 reactive ions, 44 a phase shift pattern, and 45 an oxygen plasma.

As illustrated in FIG. 1a, the etching stopper layer 31 that has a uniform thickness of 10 to 500 nm and the opaque layer 32 of 10 to 200 nm in thickness are first formed in this order on the substrate 30 that is optically polished. Then, an ionizing radiation resist such as one of chloromethylated polystyrene is uniformly coated on the layer 32 as by spin coating in conventional manners, and heated for drying into the resist layer 33 of about 0.1 to 2.0 $\mu$m in thickness. In this example, it is desired that the substrate 30 used be made of quartz or synthetic quartz of high purity, if the fact that the phase shift photomask is used for short wavelength purposes, e.g., with i-line or KrF excimer laser (248 nm) is taken into account. However, other materials such as low-expansion glass, white sheet glass, blue sheet glass (SL), $MgF_2$ and $CaF_2$ may be used as well. The etching stopper layer 31 may be made of a mixture of $Al_2O_3$ with MgO, $ZrO_2$, $Ta_2O_5$, HfO or the like. The compositional ratios of $Al_2O_3$ to MgO, $ZrO_2$, $Ta_2O_5$ and HfO are desired to be such that MgO and/or $ZrO_2$ and/or $Ta_2O_5$ and/or HfO are contained in $Al_2O_3$ in an amount of 0.1 to 10 mol. %. If the etching stopper layer is made solely of $Al_2O_3$, it loses thickness at 1 nm/min. upon immersed in concentrated sulfuric acid ($H_2SO_4$) at 80° C. However, if MgO, $ZrO_2$, $Ta_2O_5$ and HfO are incorporated in the etching stopper layer, then it does not lose thickness even upon immersed in concentrated sulfuric acid ($H_2SO_4$) at 80° C. As the stopper layer loses thickness by cleaning, there is a change in the phase difference between the portions containing phase shifter layers and not containing phase shift layers. In order to form the opaque layer 32, a chromium thin film may be provided in a single- or multi-layer form. Besides, it may be formed as of chromium nitride, chromium oxide, tungsten, molybdenum and molybdenum silicide. Usually, the drying-by-heating treatment may be carried out at 80° to 200° C. for about 5 to 60 minutes, although depending on the type of resist used.

Figure 1B:
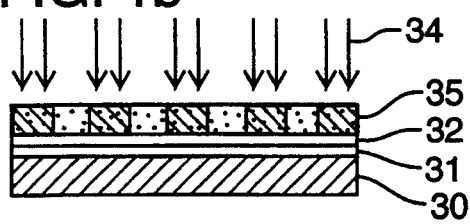
Figure 1C:
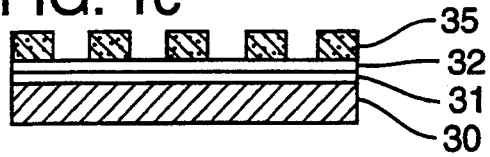

Then, as illustrated in FIG. 1b, a predetermined pattern is conventionally drawn on the resist layer 33 by the ionizing radiations 34 from photolithographic hardware such as an electron beam exposure system, then developed with a developer composed mainly of an organic solvent such as ethyl cellosolve or ester, and finally rinsed with an alcohol to form the resist pattern 35 such as one shown in FIG. 1c.

Figure 1D:
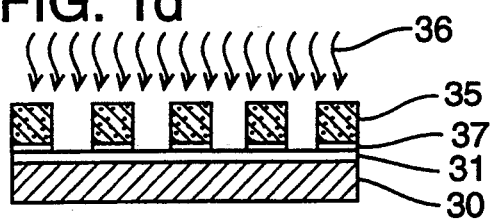

If required, heating and descumming treatments are then carried out to remove unnecessary resist portions such as resist scum and whiskers, if any, from the edge regions, etc., of the resist pattern 35. After that, as shown in FIG. 1d, the portions to be processed, that are exposed between the lines of the pattern 35, i.e., the opaque layer 32 is etched dry by the etching gas plasma 36 to form the opaque layer 37. As will be obvious to those skilled in the art, the formation of opaque layer 37 may be achieved as well, using wet etching in place of the dry etching with the etching gas plasma 36.

Figure 1E:
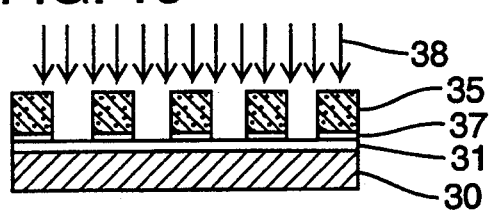
Figure 1F:
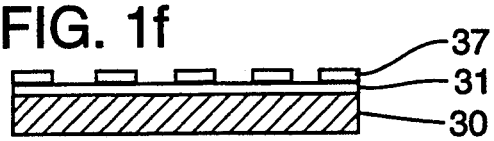

Following etching having been done in this manner, the remaining resist 35 is incinerated out by the oxygen plasma 38, as shown in FIG. 1e, thereby making such a photomask as shown in FIG. 1f, which has on the substrate 30 the etching stopper layer 31 and thereon the given opaque layer 37. It is noted that this incineration treatment using the oxygen plasma 38 may be replaced by solvent removal as well.

Figure 1G:
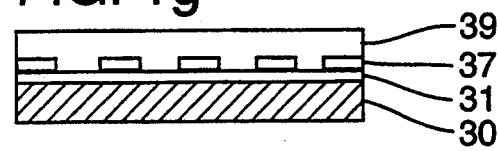

Subsequently, this photomask is inspected to make some modification to the pattern, if required, followed by cleaning. As shown in FIG. 1g, the transparent film 39 is thereafter provided on the opaque layer 37 by such coating procedures as evaporation, sputtering, CVD (chemical vapor deposition) or spin-on-glass coating (for instance, siloxane may be spin coated and heated to form an SiO$_2$ film). The thickness d of the transparent film 39 is given by $$d = \lambda/2(n-1)$$

where n is the refractive index of the material forming the transparent film 39 and $\lambda$ is the wavelength of light used for photolithography. When SOG is used at $\lambda = 365$ nm, the value of d is about 406 nm, because n=1.45.

Figure 1H:
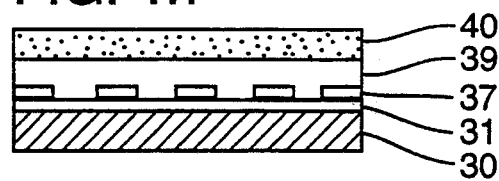
Figure 1I:
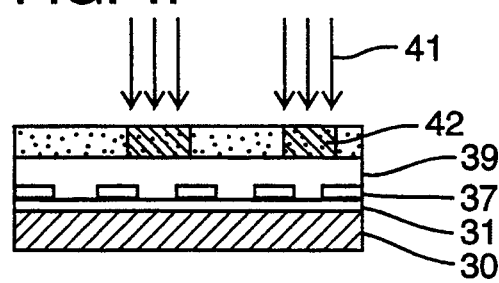
Figure 1J:
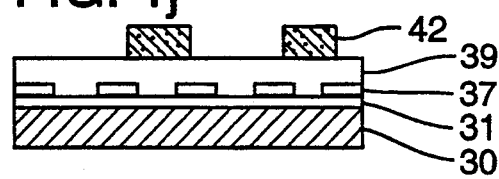

Then, an ionizing radiation resist such as chloromethylated polystyrene is uniformly coated on the transparent film 39 in the same manner as mentioned above to form the resist layer 40, as shown in FIG. 1h. Following this, the resist layer 40 is aligned as conventional, as shown in FIG. 1i, and a predetermined pattern is drawn on the position, to which the phase is to be shifted, by means of the ionizing radiations 41 from electron beam hardware for photolithography, etc., followed by development with a given developer and rinsing, whereby the resist pattern 42 is formed, as shown in FIG. 1j.

Figure 1K:
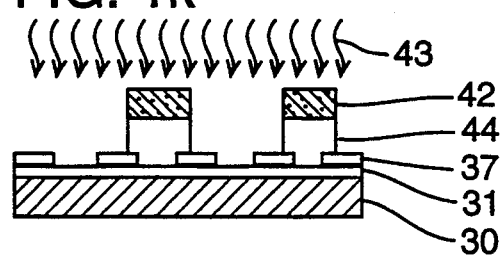

Subsequently and if required, heating and descumming treatments are carried out. Following this, portions of the transparent film 39 exposed between the resist pattern (42) lines are etched dry by the reactive ions 43, using CF$_4$, C$_2$F$_6$, CHF$_3$+O$_2$ and a mixed gas thereof to form the phase shift pattern 44, as shown in FIG. 1k. It is noted that the formation of this phase shift pattern 44 may be done as well by wet etching with a solution based on hydrofluoric acid, instead of by reactive ion etching.

At this time, conventional processes pose some problems; etching extends to the substrate 30, so that difficulty is involved in judging when and where etching has come to an end, or since the substrate 30 is etched as well, the quantity of phase shift of the phase shifter is greater than 180°, so that difficulty is involved in precise pattern transfer. According to the first aspect of the invention, however, it is possible to provide sure etching of the transparent film 39 and interrupt etching automatically, enabling a phase shift photomask of higher quality to be prepared, because the mixture of Al$_2$O$_3$ with MgO, ZrO$_2$, Ta$_2$O$_5$, HfO or the like that shows a high etching resistance with respect to the above-mentioned fluorine-based reactive ions and excels in humidity resistance as well is used as the etching stopper layer 31.

Figure 1L:
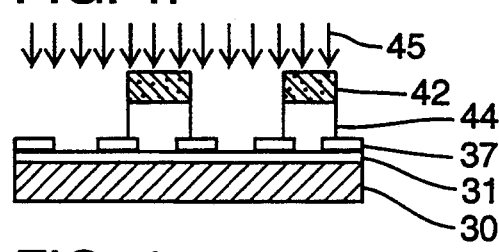
Figure 1M:
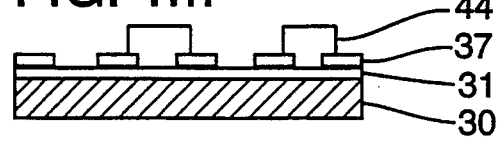

Then, the remaining resist is incinerated out by the oxygen plasma 45, as shown in FIG. 1l, whereby such a phase shift photomask of high accuracy as shown in FIG. 1m is completed. It is noted that this treatment may be carried out as well by solvent removal, instead of by incineration with the oxygen plasma 45.

It is appreciated that such an etching stopper layer may be applied not only to such a phase shift photomask as shown in FIG. 4a–d but also to those of other structures. By way of example, a brief explanation will now be made of the application of this etching stopper layer to a self-matching type of phase shift photomask that the present applicant has come up with in JP-A-2-181795.

FIG. 2a–j represents in section the steps of the process of producing such a phase shift photomask. In FIG. 2a–j, reference numeral 50 denotes a substrate, 51 an etching stopper layer comprising a mixture of Al$_2$O$_3$ with MgO, ZrO$_2$, Ta$_2$O$_5$ or HfO, 52 a transparent film, 53 an opaque thin film, 54 a resist layer, 55 a resist pattern, 56 ionizing radiations, 57 an etching gas plasma, 58 an opaque layer, 59 an oxygen plasma, 60 a resist layer, 61 photolithography from the back side, 62 reactive ions, 63 a phase shifter pattern and 64 an oxygen plasma.

As shown in FIG. 2a, the uniform etching stopper layer 51 of 10 to 500 nm in thickness, the transparent film 52 having a film thickness given by $d = \lambda/2(n-1)$ and composed mainly of SiO$_2$, and the opaque layer 53 of 50 to 200 nm in thickness are first formed on the optically polished substrate 50 in this order to construct a photomask blank.

Then, an ionizing radiation resist such as chloromethylated polystyrene is uniformly coated on this photomask blank in conventional manners using spin coating, for instance, and is thereafter subject to a drying-by-heating treatment to form the resist layer 54 that is about 0.1 to 2.0 μm in thickness.

In this example, it is desired that the substrate 50 used be made of quartz, synthetic quartz of high purity, MgF$_2$, CaF$_2$ or the like, if the fact that the phase shift photomask of the invention is usually used for short wavelength purposes, e.g., with i-line or KrF excimer laser is taken into account. For longer wavelength purposes, however, other materials such as low-expansion glass, white sheet glass, blue sheet glass (SL) or the like may be used as well. As is the case with the example shown in FIG. 1, the etching stopper layer 51 may be made of a mixture of Al$_2$O$_3$ with MgO, ZrO$_2$, Ta$_2$O$_5$, HfO or the like. The transparent film 52 is preferably a film of high-purity SiO$_2$, and may be provided by such coating procedures as evaporation, sputtering, CVD or spin-on-glass coating (for instance, siloxane may be spin-coated and heated to form an SiO$_2$ film). In order to form the opaque layer 53, a thin film of chromium, chromium nitride, chromium oxide, tungsten, molybdenum, molybdenum silicide or the like may be provided in a single- or multi-layer form.

Usually, the drying-by-heating treatment for resist may be carried out at 80° to 200° C. for about 5 to 60 minutes, although depending on the type of resist used.

Then, as illustrated in FIG. 2b, a predetermined pattern is conventionally drawn on the resist layer 54 by the ionizing radiations 56 from photolithographic hardware such as an electron beam exposure system, then developed with a developer composed mainly of an organic solvent such as ethyl cellosolve or ester, and finally rinsed with an alcohol to form the resist pattern 55 such as one shown in FIG. 2c.

Subsequently and if required, heating and descumming treatments are carried out to remove unnecessary resist portions such as resist scum and whiskers, if any, from the edge regions, etc., of the resist pattern 55. After that, as shown in FIG. 2c, the portions to be processed, that are exposed between the resist pattern (55) lines, i.e., the opaque layer 53 is etched dry by the etching gas plasma 57 to form the opaque layer 58 (FIG. 2d). As will be obvious to those skilled in the art, the formation of this opaque layer 58 may also be achieved, using wet etching in place of the dry etching with the etching gas plasma 57.

Following etching having been done in this way, the remaining resist 55 is incinerated out by the oxygen plasma 59, as shown in FIG. 2d, thereby forming on the substrate 50 the etching stopper layer 51 such as one shown in FIG. 2e. On this layer 51 the phase shift layer 52 and then the given opaque layer 58 are formed to make a photomask. It is noted that this incineration treatment using the oxygen plasma 59 may be replaced by solvent removal.

Subsequently, this photomask is inspected to make some modification to the pattern, if required, followed by cleaning. As shown in FIG. 2f, the photomask is thereafter uniformly provided on the opaque layer 58 with a photoresist as of OFPR-800 by spin coating or other conventional means, and is then dried by heating to form the resist layer 60 that is about 0.3 to 2 μm in thickness.

Subsequently, the resist layer 60 is subject to photolithography 61 from the back side through the glass substrate 50, developed with an aqueous alkali solution composed mainly of tetramethylammonium hydroxide and rinsed with pure water to form a pattern having a resist pattern on the opaque layer 58.

Then, the portion to be processed, that is exposed between the resist pattern lines, i.e., the phase shift layer 52 is etched dry by reactive ion etching using the reactive ions 62, for which $CF_4$, $C_2F_6$, $CHF_3+O_2$ and a mixed gas thereof are used, as shown in FIG. 2g, to form the phase shifter pattern 63 (FIG. 2h).

Subsequently, this substrate is treated with an etching solution composed mainly of a ceric ammonium nitrate $(Ce(NH_4)_2(NO_3)_6)$ solution to side-etch the opaque layer 58 sandwiched between the phase shifter 63 and the resist 60. The amount of this side etching is usually in a matter of 0.1 to 0.5 μm, although varying depending on the type and size of pattern.

Following etching having been done in this way, the remaining resist 60 is incinerated out by the oxygen plasma 64, as shown in FIG. 2i, to complete such a self-matching type of phase shift mask as shown in FIG. 2j.

As is the case with the example explained with reference to FIG. 1a-m, it is again possible to provide sure etching of the transparent film 52 and interrupt etching automatically, enabling a phase shift photomask of higher quality to be prepared, because the mixture of $Al_2O_3$ with MgO, $ZrO_2$, $Ta_2O_5$, HfO or the like that shows a high etching resistance with respect to the above-mentioned fluorine-based reactive ions and excels in humidity resistance as well is used as the etching stopper layer 51.

The phase shift photomask according to the second aspect of the invention is characterized in that a film comprising $CrO_x$, $CrN_y$, $CrC_z$, $CrO_xN_y$, $CrO_xC_z$ or $CrO_xN_yC_z$ is located as an etching stopper layer between the substrate and the transparent film that is to act as a phase shifter. In what follows, the phase shift photomask according to the second aspect of the invention will be explained, by way of example, with reference to how to make this phase shift photomask.

FIG. 3a-m represents in section the steps of the process of producing the phase shift photomask according to the second aspect of the invention, which is of the type that the phase shift layer is placed on the phase shifter. In FIG. 3a-m, reference numeral 69 denotes a substrate, 70 an etching stopper layer comprising $CrO_x$, $CrN_y$, $CrC_z$, $CrO_xN_y$, $CrO_xC_z$ or $CrO_xN_yC_z$, 71 a protective film of $SiO_2$, 72 an opaque layer, 73 a resist layer, 75 a resist pattern, 76 an etching gas plasma, 77 an opaque layer, 78 an oxygen plasma, 79 a transparent film, 80 a resist layer, 81 ionizing radiations, 82 a resist pattern, 83 reactive ions, 84 a phase shift pattern and 85 an oxygen plasma.

Figure 3A:
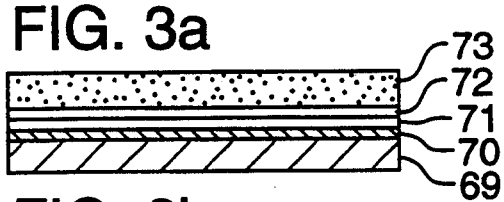
FIG. 3a-m represents in section a series of steps of the process of producing the second phase shift photomask according to the invention.

First, the etching stopper layer 70 that has a uniform thickness of 5 to 30 nm, the protective film 71 that has a thickness of 5 to 100 nm and the opaque layer 72 that has a thickness of 10 to 200 nm are formed in this order on the substrate 69 that is optically polished, as shown in FIG. 3a, and an ionizing radiation resist such as chloromethylated polystyrene is uniformly coated thereon in conventional manners, e.g., by spin coating and dried by heating to form the resist layer 73 that has a thickness in a matter of 0.1 to 2.0 μm. In this example, it is desired that the substrate 69 used be made of quartz or synthetic quartz of high purity, if the fact that the phase shift photomask of this aspect is usually used for short wavelength purposes, e.g., with i-line or KrF excimer laser is taken into account. However, other materials such as low-expansion glass, white sheet glass, blue sheet glass (SL), $MgF_2$ and $CaF_2$ may be used as well. Preferably, the etching stopper layer 70 may be formed of $CrO_x$ where x is 0.01 to 3 inclusive, $CrN_y$ where y is 0.01 to 2 inclusive, $CrC_z$ where z is 0.01 to 1.5 inclusive, $CrO_xN_y$ where x is 0.01 to 3 inclusive and y is 0.01 to 2 inclusive, $CrO_xC_z$ where x is 0.01 to 2 inclusive and z is 0.01 to 1.5 inclusive or $CrO_xN_yC_z$ where x is 0.01 to 3 inclusive, y is 0.01 to 2 inclusive and z is 0.01 to 1.5 inclusive. The use of these $CrO_x$, $CrN_y$, $CrC_z$, $CrO_xN_y$, $CrO_xC_z$ or $CrO_xN_yC_z$ assures an SOG dry etch ratio that exceeds 90. Higher dry etch ratios are more desirable, but current $SnO_2$ stopper layers have a dry etch ratio of barely 10 or below. When compared with $SnO_2$, these Cr-based stopper layers have a dry etch ratio of 90 or more. The opaque layer 72 may be made as of tungsten, molybdenum and molybdenum silicide. In view of the steps involved, however, it is preferably formed of a chromium thin film that is provided in a single- or multi-layer form, or of a chromium material such as chromium nitride or oxide, because the etching stopper layer 70 is made of a chromium material, as already noted. When a Cr-based opaque layer is used, the protective layer 71 of $SiO_2$ is located between the stopper layer 70 and the opaque layer 72. The drying-by-heating treatment for the resist layer 73 may usually be carried out at 80° to 200° C. for about 5 to 60 minutes, although depending upon the type of resist used.

Figure 3B:
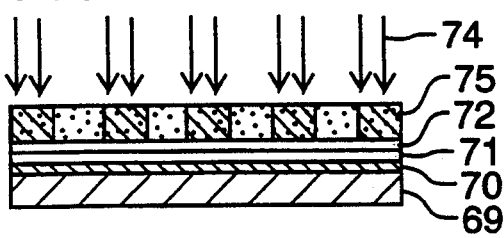
Figure 3C:
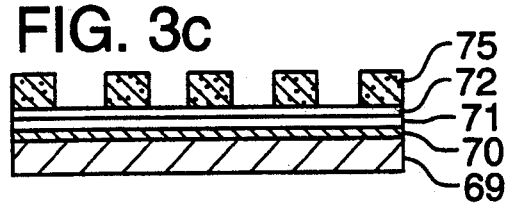

Then, as illustrated in FIG. 3b, a predetermined pattern is conventionally drawn on the resist layer 73 by the ionizing radiations 74 from photolithographic hardware such as an electron beam exposure system, then developed with a developer composed mainly of an organic solvent such as ethyl cellosolve or ester, and finally rinsed with an alcohol to form the resist pattern 75 such as one shown in FIG. 3c.

Figure 3D:
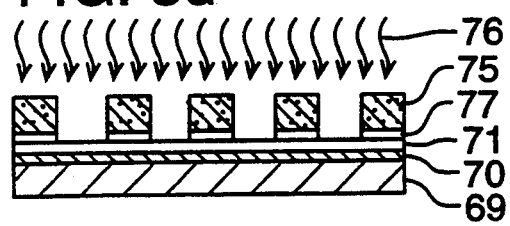

Subsequently and if required, heating and descumming treatments are carried out to remove unnecessary resist portions such as resist scum and whiskers, if any, from the edge regions, etc., of the resist pattern 75. After that, as shown in FIG. 3d, the portions to be processed, that are exposed between the resist pattern (75) lines, i.e., the opaque layer 72 is etched dry by the etching gas plasma 76 to form the opaque layer 77. In the absence of the protective layer 71, the etching stopper layer 70 will be etched simultaneously with the etching of the opaque layer 72. However, the provision of the protective layer 71 of $SiO_2$ allows the etching stopper layer 70 to remain intact. It is noted that the formation of this opaque layer 77 may also be achieved by wet etching instead of by drying etching using the etching gas plasma 76.

Figure 3E:
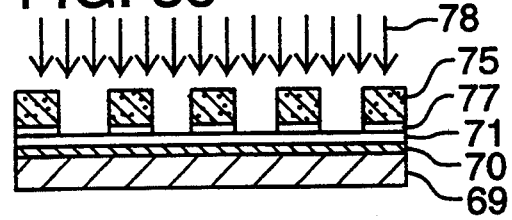
Figure 3F:
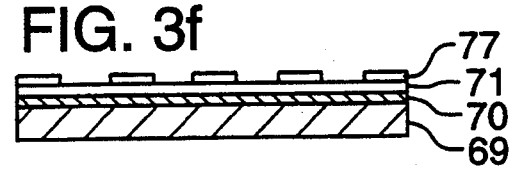

Following etching in this manner, the remaining resist 75 is incinerated out by the oxygen plasma 78, as shown in FIG. 3e, thereby forming a photomask that has on the substrate 69 the etching stopper layer 70 such as one shown in FIG. 3f and thereon the given opaque layer 77. It is noted that this incineration treatment using the oxygen plasma 78 may also be achieved by solvent removal.

Figure 3G:
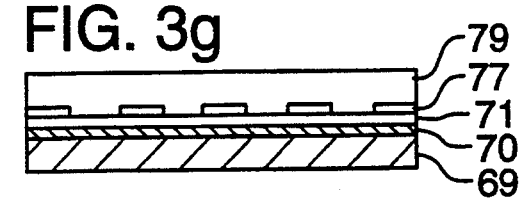

Subsequently, this photomask is inspected to make some modification to the pattern, if required, followed by cleaning. As shown in FIG. 3g, the transparent film 79 is thereafter provided on the opaque layer 77 by such coating procedures as evaporation, sputtering, CVD or spin-on-glass coating (for instance, siloxane may be spin-coated and heated to form an $SiO_2$ film). The thickness d of the transparent film 79 is given by $$d = \lambda/2(n-1)$$

where n is the refractive index of the material forming the transparent film 79 and $\lambda$ is the wavelength of light used for photolithography. When SOG is used at $k = 365$ nm, the value of d is about 406 nm, because $n = 1.45$.

Figure 3H:
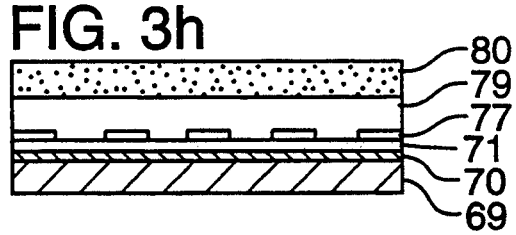
Figure 3I:
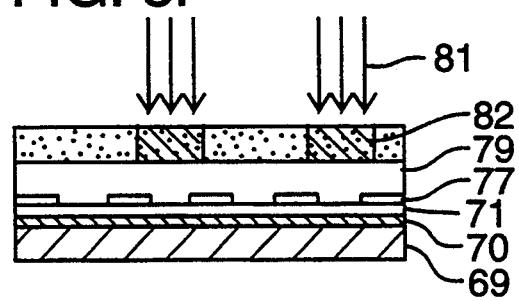
Figure 3J:
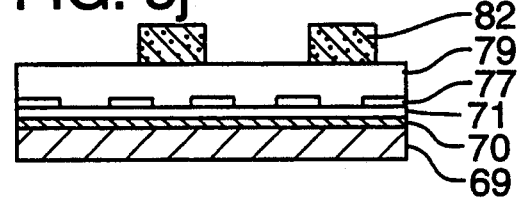

Then, an ionizing radiation resist such as chloromethylated polystyrene is uniformly coated on the transparent film 79 in the same manner as mentioned above to form the resist layer 80, as shown in FIG. 3h. Following this, the resist layer 80 is aligned as conventional, as shown in FIG. 3i, and a predetermined pattern is drawn on the position, to which the phase is to be shifted, by means of the ionizing radiations 81 from electron beam hardware for photolithography, etc., followed by development with a given developer and rinsing, whereby the resist pattern 82 is formed, as shown in FIG. 3j.

Figure 3K:
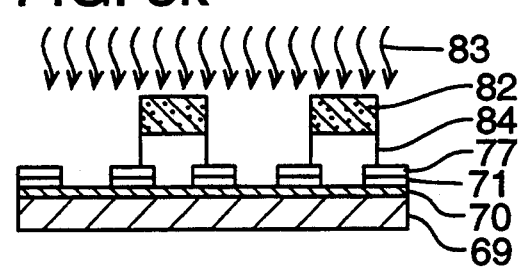

Subsequently and if required, heating and descumming treatments are carried out. Following this, portions of the transparent film 79 exposed between the resist pattern (82) lines are etched dry by the reactive ions 83, using $CF_4$, $C_2F_6$, $CHF_3 + O_2$ and a mixed gas thereof to form the phase shift pattern 84, as shown in FIG. 3k. It is noted that the formation of this phase shift pattern 84 may be achieved as well by wet etching with a solution based on hydrofluoric acid, instead of by reactive ion etching.

At this time, conventional processes pose some problems; etching extends to the substrate 69, so that difficulty is involved in judging when and where etching has come to an end, or since the substrate 69 is etched as well, the quantity of phase shift of the phase shifter is greater than 180°, so that difficulty is involved in precise pattern transfer. According to the second aspect of the invention, however, it is again possible to provide sure etching of the transparent film 79 and interrupt etching automatically, enabling a phase shift photomask of higher quality to be prepared, because $CrO_x$, $CrN_y$, $CrC_z$, $CrO_xN_y$, $CrO_xC_z$ or $CrO_xN_yC_z$ that shows a high etching resistance with respect to the reactive ions and etching solution as well is used as the etching stopper layer 70. It is noted that a portion of the protective layer 71 located below the transparent film 79 is simultaneously etched out during this etching process.

Figure 3L:
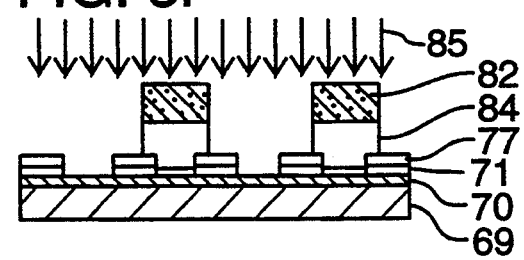
Figure 3M:
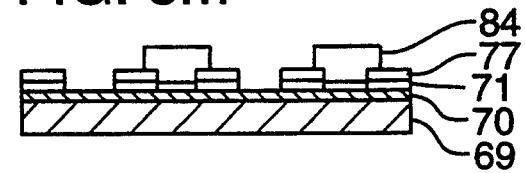

Then, the remaining resist is incinerated out by the oxygen plasma 85, as shown in FIG. 3l, whereby such a phase shift photomask of high accuracy as shown in FIG. 3m is completed. It is noted that this treatment may be carried out as well by solvent removal, instead of by incineration by the oxygen plasma 85.

It is appreciated that this etching stopper layer may be applied not only to a phase shift photomask of the type that the phase shift layer is placed on the phase shifter, as shown in FIG. 3a-m, but also to a phase shift photomask of the type that the phase shift layer is placed below the phase shifter. By way of example, a brief explanation will now be made of the application of this etching stopper layer to a self-matching type of phase shift photomask that the present applicant has come up with in JP-A-2-181795.

FIG. 2a-j represents in section the steps of the process of producing such a phase shift photomask. In FIG. 2a-j, reference numeral 50 denotes a substrate, 51 an etching stopper layer comprising $CrO_x$, $CrN_y$, $CrC_z$, $CrO_xN_y$, $CrO_xC_z$ or $CrO_xN_yC_z$, 52 a transparent film, 53 a opaque thin film, 54 a resist layer, 55 a resist pattern, 56 ionizing radiations, 57 an etching gas plasma, 58 an opaque layer, 59 an oxygen plasma, 60 a resist layer, 61 photolithography from the back side, 62 reactive ions, 63 a phase shifter pattern and 64 an oxygen plasma.

As shown in FIG. 2a, the etching stopper layer 51 that has a uniform thickness of 5 to 30 nm and the transparent film 52 that has a film thickness given by $d = \lambda/2(n-11)$ and composed mainly of $SiO_2$, and the opaque layer 53 of 50 to 200 nm in thickness are first formed in this order on the substrate 50 that is optically polished, thereby to construct a photomask blank.

Then, an ionizing radiation resist such as chloromethylated polystyrene is uniformly coated on this photomask blank in conventional manners using spin coating, for instance, and is thereafter subject to a drying-by-heating treatment to form the resist layer 54 that is about 0.1 to 2.0 μm in thickness.

In this example, it is desired that the substrate 50 used be made of quartz, synthetic quartz of high purity, $MgF_2$, $CaF_2$ or the like, if the fact that the phase shift photomask of the invention is usually used for short wavelength purposes, e.g., with i-line or KrF excimer laser is taken into account. For longer wavelength purposes, however, other materials such as low-expansion glass, white sheet glass, blue sheet glass (SL) or the like may be used as well. As is the case with the example shown in FIG. 3a-m, the etching stopper layer 51 may be made of $CrO_x$, $CrN_y$, $CrC_z$, $CrO_xN_y$, $CrO_xC_z$ or $CrO_xN_yC_z$. The transparent film 52 is preferably a film of high-purity $SiO_2$, and may be provided by such coating procedures as evaporation, sputtering, CVD or spin-on-glass coating (for instance, siloxane may be spin-coated and heated to form an $SiO_2$ film). In order to form the opaque layer 53, a thin film of chromium, chromium nitride, chromium oxide, tungsten, molybdenum, molybdenum silicide or the like may be provided in a single- or multi-layer form.

Usually, the drying-by-heating treatment for resist may be carried out at 80° to 200° C. for about 5 to 60 minutes, although depending on the type of resist used.

Then, as illustrated in FIG. 2b, a predetermined pattern is conventionally drawn on the resist layer 54 by the ionizing radiations 56 from photolithographic hardware such as an electron beam exposure system, then developed with a developer composed mainly of an organic solvent such as ethyl cellosolve or ester, and finally rinsed with an alcohol to form the resist pattern 55 such as one shown in FIG. 2c.

Subsequently and if required, heating and descumming treatments are carried out to remove unnecessary resist portions such as resist scum and whiskers, if any, from the edge regions, etc., of the resist pattern 55. After that, as shown in FIG. 2c, the portions to be processed, that are exposed between the resist pattern (55) lines, i.e., the opaque layer 53 is etched dry by the etching gas plasma 57 to form the opaque layer 58 (FIG. 2d). As will be obvious to those skilled in the art, the formation of this opaque layer 58 may also be achieved, using wet etching in place of the dry etching with the etching gas plasma 57.

Following etching having been done in the this manner, the remaining resist 55 is incinerated out by the oxygen plasma 59, as shown in FIG. 2d, thereby forming on the substrate 50 the etching stopper layer 51 such as one shown in FIG. 2e. On this layer 51 the phase shift layer 52 and then the given opaque layer 58 are formed to make a photomask. It is noted that this incineration treatment using the oxygen plasma 59 may be replaced by solvent removal.

Subsequently, this photomask is inspected to make some modification to the pattern, if required, followed by cleaning. As shown in FIG. 2f, the photomask is thereafter uniformly provided on the opaque layer 58 with a photoresist as of OFPR-800 by spin coating or other conventional means, and is then dried by heating to form the resist layer 60 that is about 0.3 to 2 μm in thickness.

Subsequently, the resist layer 60 is subject to backward photolithography 61 through the glass substrate 50, developed with an aqueous alkali solution composed mainly of tetramethylammonium hydroxide and rinsed with pure water to form a pattern having a resist pattern on the opaque layer 58.

Then, the portion to be processed, that is exposed between the resist pattern lines, i.e., the phase shift layer 52 is etched dry by reactive ion etching using the reactive ions 62, for which $CF_4$, $C_2F_6$, $CHF_3+O_2$ and a mixed gas thereof are used, as shown in FIG. 2g, to form the phase shifter pattern 63 (FIG. 2h).

Subsequently, this substrate is treated with an etching solution composed mainly of a ceric ammonium nitrate solution to side-etch the opaque layer 58 sandwiched between the phase shifter 63 and the resist 60. The amount of this side etching is usually in a matter of 0.1 to 0.5 μm, although varying depending on the type and size of pattern.

Following etching having been done in this way, the remaining resist 60 is incinerated out by the oxygen plasma 64, as shown in FIG. 2i, to complete such a self-matching type of phase shift mask as shown in FIG. 2j.

As is the case with the example explained with reference to FIG. 3a–m, it is again possible to provide sure etching of the transparent film 52 and interrupt etching automatically, enabling a phase shift photomask of higher quality to be prepared, because $CrO_x$, $CrN_y$, $CrC_z$, $CrO_xN_y$, $CrO_xC_z$ or $CrO_xN_yC_z$ that shows a high etching resistance with respect to the reactive ions and excels in humidity resistance is used as the etching stopper layer 51. It is noted that for the phase shift photomask of the type that the phase shift layer is placed below the opaque layer, it is not always required to provide the protective layer of $SiO_2$ on the etching stopper layer, as is the case with the FIG. 3a–m example of the type that the phase shift layer is placed on the phase shifter.

The phase shift photomask according to the third aspect of the invention is characterized in that a film comprising $MgF_{2-2x}O_y$, $CaF_{2-2x}O_y$, $LiF_{2-2x}O_y$, $BaF_{2-2x}O_y$, $La_2F_{6-2x}O_y$ or $Ce_2F_{6-2x}O_y$ is located as an etching stopper layer between the substrate and the transparent film that is to act as a phase shifter. Metal fluorides such as $MgF_2$ are known as a material that shows a good transmittance at short wavelengths. Even a substrate of about 1 mm in thickness shows an i-line transmittance exceeding 93% and a KrF excimer laser light transmittance exceeding 92%. Usually, when $MgF_2$ is used as an etching stopper layer, use is made of sputtering that uses a metal fluoride such as $MgF_2$ as the target and employs an inert gas such as Ar. The film that is then formed on the substrate becomes rich in metal and, at a 100 nm-thickness, shows an i-line transmittance reduced to about 62% and a KrF laser transmittance reduced to about 50%. To ward off this, it is considered to use reactive sputtering using an inert gas with fluorine gas incorporated in it. However, the fluorine gas is a corrosive gas, and so is not practically usable because of posing a problem in connection with equipment corrosion.

The third aspect of the invention is characterized by preparing $MgF_{2-2x}O_y$, etc., by effecting sputtering using an inert gas mixed with oxygen as the sputtering gas, which makes it possible to produce a practical-enough etching stopper layer that assures similar dry etch ratios with respect to a phase shifter, i-line transmittance and KrF excimer laser light transmittance as obtained with $MgF_2$, etc.

In the following description, the phase shift photomask according to the third aspect of the invention will be explained, by way of example, with reference to how to produce the phase shift photomask.

FIG. 1a–m also represents in section the steps of the process of producing a photomask containing a phase shift layer according to the 3rd aspect of the invention (a phase shift photomask). In FIG. 1a–m, reference numeral 30 stands for a substrate, 31 an etching stopper layer comprising $MgF_{2-2x}O_y$, $CaF_{2-2x}O_y$, $LiF_{2-2x}O_y$, $BaF_{2-2x}O_y$, $La_2F_{6-2x}O_y$ or $Ce_2F_{6-2x}O_y$, 32 an opaque layer, 33 a resist layer, 34 ionizing radiations, 35 a resist pattern, 36 an etching gas plasma, 37 an opaque layer, 38 an oxygen plasma, 39 a transparent film, 40 a resist layer, 41 ionizing radiations, 42 a resist pattern, 43 reactive ions, 44 a phase shift pattern, and 45 an oxygen plasma.

As illustrated in FIG. 1a, the etching stopper layer 31 that has a uniform thickness of 10 to 200 nm and the opaque layer 32 of 10 to 200 nm in thickness are first formed in this order on the substrate 30 that is optically polished. Then, an ionizing radiation resist such as one of chloromethylated polystyrene is uniformly coated on the layer 32 as by spin coating in conventional manners, and heated for drying into the resist layer 33 of about 0.1 to 2.0 μm in thickness. In this example, it is desired that the substrate 30 used be made of quartz or synthetic quartz of high purity, if the fact that the phase shift photomask is used for short wavelength purposes, e.g., with i-line or KrF excimer laser is taken into account. However, other materials such as low-expansion glass, white sheet glass, blue sheet glass (SL), MgF$_2$ and CaF$_2$ may be used as well. The etching stopper layer 31 may be made of MgF$_{2-2x}$O$_y$, CaF$_{2-2x}$O$_y$, LiF$_{2-2x}$O$_y$, BaF$_{2-2x}$O$_y$, La$_2$F$_{6-2x}$O$_y$ or Ce$_2$F$_{6-2x}$O$_y$. It is here noted that x is desired to lie between 0.01 and 0.5 and y to be $\leq$ x. When argon is used for the sputtering gas, x and y lying in the above ranges are obtained by mixing the gas with 50% or less of oxygen. At this time, the i-line transmittance is 92%, the KrF excimer laser light transmittance is 90% and the etching dry etch ratio with respect to SOG is 120.

In addition, the opaque layer 32 may be made of a chromium thin film that is provided in a single- or multi-layer form. Alternatively, it may be made of chromium nitride, chromium oxide, tungsten, molybdenum, molybdenum silicide or the like. The drying-by-heating treatment for resist may usually be carried out at 80° to 200° C. for about 5 to 60 minutes, although depending on the type of resist used.

Then, as illustrated in FIG. 1b, a predetermined pattern is conventionally drawn on the resist layer 33 by the ionizing radiations 34 from photolithographic hardware such as an electron beam exposure system, then developed with a developer composed mainly of an organic solvent such as ethyl cellosolve or ester, and finally rinsed with an alcohol to form the resist pattern 35 such as one shown in FIG. 1c.

If required, heating and descumming treatments are then carried out to remove unnecessary resist portions such as resist scum and whiskers, if any, from the edge regions, etc., of the resist pattern 35. After that, as shown in FIG. 1d, the portions to be processed, that are exposed between the pattern (35) lines, i.e., the opaque layer 32 is etched dry by the etching gas plasma 36 to form the opaque layer 37. As will be obvious to those skilled in the art, the formation of this opaque layer 37 may be achieved as well, using wet etching in place of the dry etching with the etching gas plasma 36.

Following etching in this manner, the remaining resist 35 is incinerated out by the oxygen plasma 38, as shown in FIG. 1e, thereby forming on the substrate 30 the etching stopper layer 31 such as one shown in FIG. 1f. It is noted that this incineration treatment using the oxygen plasma 38 may be replaced by solvent removal.

Subsequently, this photomask is inspected to make some modification to the pattern, if required, followed by cleaning. As shown in FIG. 1g, the transparent film 39 is thereafter provided on the opaque layer 37 by such coating procedures as evaporation, sputtering, CVD or spin-on-glass coating (for instance, siloxane may be spin-coated and heated to form an SiO$_2$ film). The thickness d of the transparent film 39 is given by $$d = \lambda/2(n-1)$$

where n is the refractive index of the material forming the transparent film 39 and λ is the wavelength of light used for exposure. When SOG is used at λ=365 nm, the value of d is about 406 nm, because n=1.45.

Then, an ionizing radiation resist such as chloromethylated polystyrene is uniformly coated on the transparent film 39 in the same manner as mentioned above to form the resist layer 40, as shown in FIG. 1h. Following this, the resist layer 40 is aligned as conventional, as shown in FIG. 1i, and a predetermined pattern is drawn on the position, to which the phase is to be shifted, by means of the ionizing radiations 41 from electron beam hardware for photolithography, etc., followed by development with a given developer and rinsing, whereby the resist pattern 42 is formed, as shown in FIG. 1j.

Subsequently and if required, heating and descumming treatments are carried out. Following this, portions of the transparent film 39 exposed between the resist pattern (42) lines are etched dry by the reactive ions 43, using CF$_4$, C$_2$F$_6$, CHF$_3$+O$_2$ and a mixed gas thereof to form the phase shift pattern 44, as shown in FIG. 1k. It is noted that the formation of this phase shift pattern 44 may be done as well by wet etching with a solution based on hydrofluoric acid, instead of by reactive ion etching.

At this time, conventional processes pose some problems; etching extends to the substrate 30, so that difficulty is involved in judging when and where etching has come to an end, or since the substrate 30 is etched as well, the quantity of phase shift of the phase shifter is greater than 180°, so that difficulty is involved in precise pattern transfer. According to the third aspect of the invention, however, it is likewise possible to provide sure etching of the transparent film 39 and interrupt etching automatically, enabling a phase shift photomask of higher quality to be prepared, because MgF$_{2-2x}$O$_y$, CaF$_{2-2x}$O$_y$, LiF$_{2-2x}$O$_y$, BaF$_{2-2x}$O$_y$, La$_2$F$_{6-2x}$O$_y$ or Ce$_2$F$_{6-2x}$O$_y$ that shows a high etching resistance with respect to the above-mentioned fluorine-based reactive ions and excels in transparency and hardness as well is used as the etching stopper layer 31.

Then, the remaining resist is incinerated out by the oxygen plasma 45, as shown in FIG. 1l, whereby such a phase shift photomask of high accuracy as shown in FIG. 1m is completed. It is noted that this treatment may be carried out as well by solvent removal, instead of by incineration by the oxygen plasma 45.

Figure 4A:
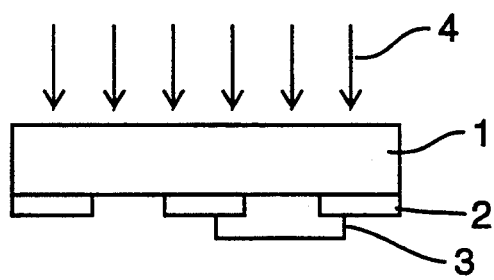
FIG. 4a-d represents in section the principles of the phase shift process.
Figure 5A:
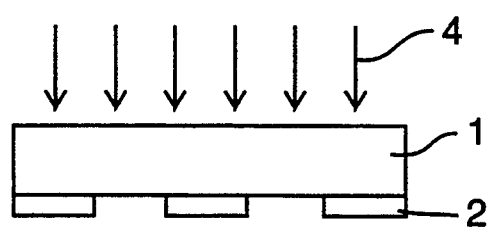
FIG. 5a-d represents in section a conventional process.
Figure 4B:
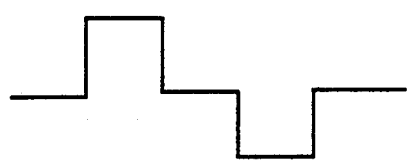
Figure 5B:
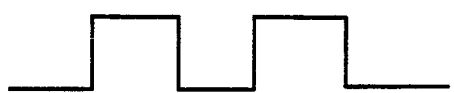
Figure 4C:
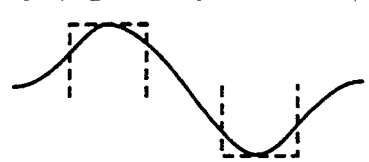
Figure 5C:
Figure 4D:
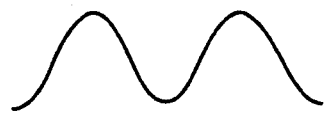
Figure 5D:
Figure 6A:
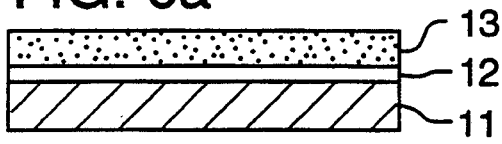
FIG. 6a-m represents in section a series of a conventional process of producing a phase shift photomask.
Figure 6B:
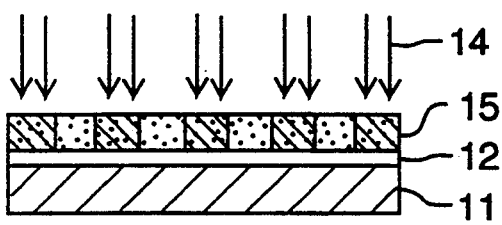
Figure 6C:
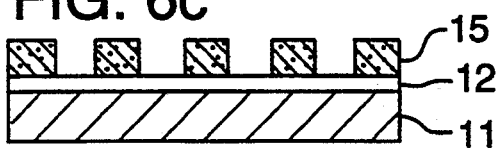
Figure 6D:
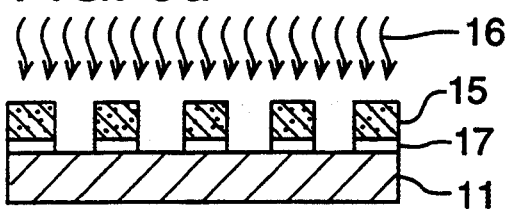
Figure 6E:
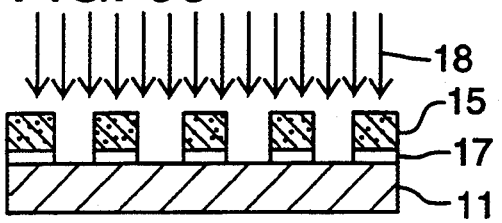
Figure 6F:
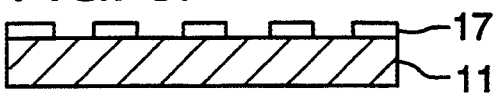
Figure 6G:
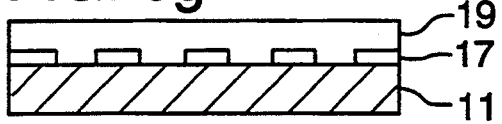
Figure 6H:
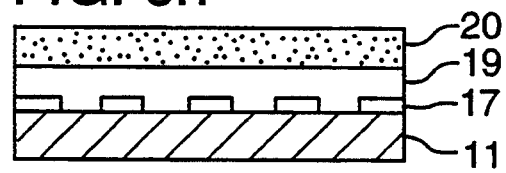
Figure 6I:
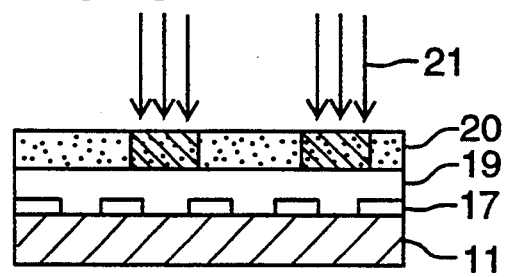
Figure 6J:
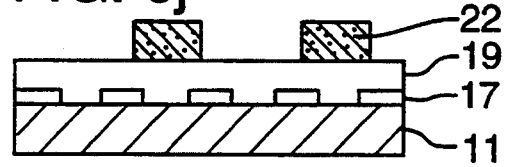
Figure 6K:
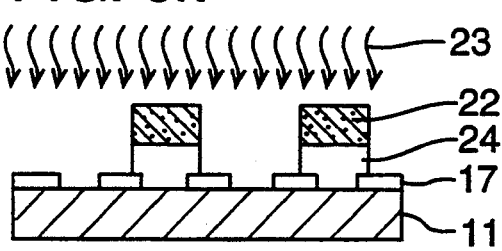
Figure 6L:
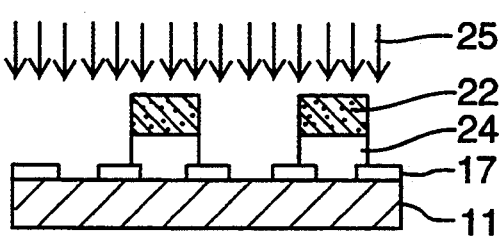
Figure 6M:
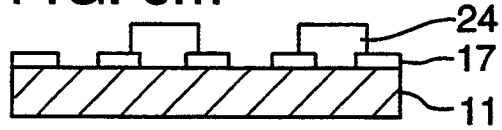

It is appreciated that this etching stopper layer may be applied not only to a phase shift photomask of the type that the phase shift layer is placed on the phase shifter, as shown in FIG. 4a, but also to a phase shift photomask of the type that the phase shift layer is placed below the phase shifter. By way of example, a brief explanation will now be made of the application of this etching stopper layer to a self-matching type of phase shift photomask that the present applicant has come up with in JP-A-2-181795.

FIG. 2a–j represents in section the steps of the process of producing such a phase shift photomask. In FIG. 2a–j, reference numeral 50 denotes a substrate, 51 an etching stopper layer comprising MgF$_{2-2x}$O$_y$, CaF$_{2-2x}$O$_y$, LiF$_{2-2x}$O$_y$, BaF$_{2-2x}$O$_y$, La$_2$F$_{6-2x}$O$_y$ or Ce$_2$F$_{6-2x}$O$_y$, 52 a transparent film, 53 a opaque thin film, 54 a resist layer, 55 a resist pattern, 56 ionizing radiations, 57 an etching gas plasma, 58 an opaque layer, 59 an oxygen plasma, 60 a resist layer, 61 photolithography from the back side 62 reactive ions, 63 a phase shifter pattern and 64 an oxygen plasma.

As shown in FIG. 2a, the etching stopper layer 51 that has a uniform thickness of 10 to 200 nm, the transparent film 52 that has a film thickness given by d=λ/2(n−1) and composed mainly of SiO$_2$, and the opaque layer 53 of 50 to 200 nm in thickness are first formed in this order on the substrate 50 that is optically polished, thereby to construct a photomask blank.

Then, an ionizing radiation resist such as chloromethylated polystyrene is uniformly coated on this photomask blank in conventional manners using spin coating, for instance, and is thereafter subject to a drying-by-heating treatment to form the resist layer 54 that is about 0.1 to 2.0 $\mu$m in thickness.

In this example, it is desired that the substrate 50 used be made of quartz, synthetic quartz of high purity, $MgF_2$, $CaF_2$ or the like, if the fact that the phase shift photomask of the invention is usually used for short wavelength purposes, e.g., with i-line or KrF excimer laser is taken into account. For longer wavelength purposes, however, other materials such as low-expansion glass, white sheet glass, blue sheet glass (SL) or the like may be used as well. As is the case with the example shown in FIG. 1a-m, the etching stopper layer 51 may be made of $MgF_{2-2x}O_y$, $CaF_{2-2x}O_y$, $LiF_{2-2x}O_y$, $BaF_{2-2x}O_y$, $La_2F_{6-2x}O_y$ or $Ce_2F_{6-2x}O_y$ where x is desired to lie between 0.01 and 0.5 and y to b$\leq$x. The transparent film 52 is preferably a film of high-purity $SiO_2$, and may be provided by such coating procedures as evaporation, sputtering, CVD or spin-on-glass coating (for instance, siloxane may be spin-coated and heated to form an $SiO_2$ film). In order to form the opaque layer 53, a thin film of chromium, chromium nitride, chromium oxide, tungsten, molybdenum, molybdenum silicide or the like may be provided in a single- or multi-layer form.

Usually, the drying-by-heating treatment for resist may be carried out at 80° to 200° C. for about 5 to 60 minutes, although depending on the type of resist used.

Then, as illustrated in FIG. 2b, a predetermined pattern is conventionally drawn on the resist layer 54 by the ionizing radiations 56 from photolithographic hardware such as an electron beam exposure system, then developed with a developer composed mainly of an organic solvent such as ethyl cellosolve or ester, and finally rinsed with an alcohol to form the resist pattern 55 such as one shown in FIG. 2c.

Subsequently and if required, heating and descumming treatments are carried out to remove unnecessary resist portions such as resist scum and whiskers, if any, from the edge regions, etc., of the resist pattern 55. After that, as shown in FIG. 2c, the portions to be processed, that are exposed between the resist pattern (55) lines, i.e., the opaque layer 53 is etched dry by the etching gas plasma 57 to form the opaque layer 58 (FIG. 2d). As will be obvious to those skilled in the art, the formation of this opaque layer 58 may also be achieved, using wet etching in place of the dry etching with the etching gas plasma 57.

Following etching having been done in the this manner, the remaining resist 55 is incinerated out by the oxygen plasma 59, as shown in FIG. 2d, thereby forming on the substrate 50 the etching stopper layer 51 such as one shown in FIG. 2e. On this layer 51 the phase shift layer 52 and then the given opaque layer 58 are formed to make a photomask. It is noted that this incineration treatment using the oxygen plasma 59 may be replaced by solvent removal.

Subsequently, this photomask is inspected to make some modification to the pattern, if required, followed by cleaning. As shown in FIG. 2f, the photomask is thereafter uniformly provided on the opaque layer 58 with a photoresist as of OFPR-800 by spin coating or other conventional means, and is then dried by heating to form the resist layer 60 that is about 0.3 to 2 $\mu$m in thickness.

Subsequently, the resist layer 60 is subject to photolithography 61 from the back side through the glass substrate 50, developed with an aqueous alkali solution composed mainly of tetramethylammonium hydroxide and rinsed with pure water to form a pattern having a resist pattern on the opaque layer 58.

Then, the portion to be processed, that is exposed between the resist pattern lines, i.e., the phase shift layer 52 is etched dry by reactive ion etching using the reactive ions 62, for which $CF_4$, $C_2F_6$, $CHF_3+O_2$ and a mixed gas thereof are used, as shown in FIG. 2g, to form the phase shifter pattern 63 (FIG. 2h).

Subsequently, this substrate is treated with an etching solution composed mainly of a ceric ammonium nitrate solution to side-etch the opaque layer 58 sandwiched between the phase shifter 63 and the resist 60. The amount of this side etching is usually in a matter of 0.1 to 0.5 $\mu$m, although varying depending on the type and size of pattern.

Following etching having been done in this way, the remaining resist 60 is incinerated out by the oxygen plasma 64, as shown in FIG. 2i, to complete such a self-matching type of phase shift mask as shown in FIG. 2j.

As is the case with the example explained with reference to FIG. 3a-m, it is also possible to provide sure etching of the transparent film 52 and interrupt etching automatically, enabling a phase shift photomask of higher quality to be prepared, because $MgF_{2-2x}O_y$, $CaF_{2-2x}O_y$, $LiF_{2-2x}O_y$, $BaF_{2-2x}O_y$, $La_2F_{6-2x}O_y$ or $Ce_2F_{6-2x}O_y$ that shows a high etching resistance with respect to the reactive ions and excels in transparent and hardness as well is used as the etching stopper layer 51.

While the invention has been explained with reference to the examples of the phase shift photomasks according to the 1st to 3rd aspects thereof, it is understood that the invention is not limited to such examples and so may be variously modified. It is also appreciated that the etching stopper layer made of the above material may be applicable to every conventional type of phase shift photomask, e.g., a halftone phase shift photomask.

What we claim is:

1. A phase shift photomask at least comprising a substrate and a phase shifter pattern comprising a material composed mainly of silicon oxide that is provided on the surface of the substrate directly or with an opaque layer interposed therebetween, characterized in that the substrate is provided on the surface with a light transmissive etching stopper layer that comprises $CrO_x$, $CrN_y$, $CrC_z$, $CrO_xN_y$, $CrO_xC_z$ or $CrO_xN_yC_z$ wherein for $CrO_x$, x is 0.01 to 3 inclusive, for $CrN_y$, y is 0.01 to 2 inclusive, for $CrC_z$, z is 0.01 to 1.5 inclusive, for $CrO_xN_y$, x is 0.01 to 3 inclusive and y is 0.01 to 2 inclusive, for $CrO_xC_z$, x is 0.01 to 2 inclusive and z is 0.01 to 1.5 inclusive, and for $CrO_xN_yC_z$, x is 0.01 to 3 inclusive, y is 0.01 to 2 inclusive and z is 0.01 to 1.5 inclusive.

2. A phase shift photomask as claimed in claim 1, characterized in that the phase shifter pattern is provided on the surface of the substrate through the opaque layer and a protective layer as a silicon oxide layer is interposed between the etching stopper layer and the opaque layer.

3. A phase shift photomask at least comprising a substrate and a phase shifter pattern comprising a material composed mainly of silicon oxide that is provided on the surface of the substrate directly or with an opaque layer interposed therebetween, characterized in that the substrate is provided on the surface with a film that comprises $MgF_{2-2x}O_y$, $CaF_{2-2x}O_y$, $LiF_{2-2x}O_y$, $BaF_{2-2x}O_y$, $La_2F_{6-2x}O_y$ or $Ce_2F_{6-2x}O_y$ wherein x is between 0.01 and 0.5 and y is not greater than x.

4. A phase shift photomask at least comprising a substrate and a phase shifter pattern comprising a material composed mainly of silicon oxide that is provided on the surface of the substrate directly or with an opaque layer interposed therebetween, characterized in that the substrate is provided on the surface with a light transmissive film that comprises a mixture of $Al_2O_3$ with MgO, $ZrO_2$, $Ta_2O_5$, or HfO wherein said additional metal oxide is contained in the aluminum oxide in an amount of 0.1 to 10 mol. %.

5. A phase shift photomask according to claim 4, wherein said film is of a thickness of 10 to 500 nm.

* * * * *